(12) United States Patent
Zhang

(10) Patent No.: US 12,207,518 B2
(45) Date of Patent: Jan. 21, 2025

(54) DISPLAY SUBSTRATE WITH PIXEL DEFINING LAYERS HAVING COMMUNICATION SLOTS IN GAPS BETWEEN ADJACENT ROWS OF SUB-PIXELS

(71) Applicant: BOE Technology Group Co., Ltd., Beijing (CN)

(72) Inventor: Yue Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 411 days.

(21) Appl. No.: 17/762,318

(22) PCT Filed: May 21, 2021

(86) PCT No.: PCT/CN2021/095047
§ 371 (c)(1),
(2) Date: Mar. 21, 2022

(87) PCT Pub. No.: WO2021/249158
PCT Pub. Date: Dec. 16, 2021

(65) Prior Publication Data
US 2022/0392967 A1 Dec. 8, 2022

(30) Foreign Application Priority Data
Jun. 10, 2020 (CN) .......................... 202010528055.5

(51) Int. Cl.
*H10K 59/35* (2023.01)
*H10K 50/805* (2023.01)
(Continued)

(52) U.S. Cl.
CPC ......... *H10K 59/353* (2023.02); *H10K 50/805* (2023.02); *H10K 59/122* (2023.02);
(Continued)

(58) Field of Classification Search
CPC ........... H10K 2102/302; H10K 59/351; H10K 59/353; H10K 59/111; H10K 59/352;
(Continued)

(56) References Cited

U.S. PATENT DOCUMENTS

2014/0361260 A1* 12/2014 Kim ..................... H10K 59/122
438/23
2016/0043150 A1 2/2016 Wang et al.
(Continued)

FOREIGN PATENT DOCUMENTS

CN          103311269 A      9/2013
CN          104299968 A      1/2015
(Continued)

OTHER PUBLICATIONS

CN202010528055.5 first office action.

*Primary Examiner* — Alonzo Chambliss
(74) *Attorney, Agent, or Firm* — IPro, PLLC

(57) ABSTRACT

The display substrate includes: a base substrate; a pixel defining layer on the base substrate, and an organic light-emitting functional layer. The pixel defining layer includes: openings in sub-pixels respectively and communication slots. The organic light-emitting functional layer corresponding to the sub-pixels is provided in the openings. In at least one row of pixels, openings of sub-pixels of the same color communicate with one another through corresponding communication slots. At least of a portion of the communication slots are located in gaps between adjacent rows of pixels.

20 Claims, 10 Drawing Sheets

(51) Int. Cl.
*H10K 59/122* (2023.01)
*H10K 71/00* (2023.01)
*H10K 71/13* (2023.01)
*H10K 59/12* (2023.01)

(52) U.S. Cl.
CPC ......... *H10K 59/351* (2023.02); *H10K 59/352* (2023.02); *H10K 71/00* (2023.02); *H10K 71/135* (2023.02); *H10K 59/1201* (2023.02)

(58) Field of Classification Search
CPC .... H10K 50/805; H10K 71/135; H10K 71/00; H10K 77/111; H01L 27/3218; H01L 27/3246; H01L 51/0005; H01L 2227/323
See application file for complete search history.

(56) References Cited

U.S. PATENT DOCUMENTS

| | | | |
|---|---|---|---|
| 2016/0056218 A1* | 2/2016 | Wang | H10K 71/13 |
| | | | 438/34 |
| 2016/0351632 A1 | 12/2016 | Iguchi et al. | |
| 2020/0176531 A1 | 6/2020 | Baek et al. | |
| 2020/0243621 A1 | 7/2020 | Zhao | |

FOREIGN PATENT DOCUMENTS

| | | | | |
|---|---|---|---|---|
| CN | 108807457 A | 11/2018 | | |
| CN | 111244137 A | 6/2020 | | |
| CN | 111640772 A | 9/2020 | | |
| JP | 2007115529 A | 5/2007 | | |
| KR | 20160067544 A | 6/2016 | | |
| WO | WO-2018196271 A1 * | 11/2018 | .............. | B41J 3/407 |

\* cited by examiner

DISPLAY SUBSTRATE WITH PIXEL DEFINING LAYERS HAVING COMMUNICATION SLOTS IN GAPS BETWEEN ADJACENT ROWS OF SUB-PIXELS

CROSS REFERENCE TO RELATED APPLICATIONS

The present disclosure is a national phase entry under 35 U.S.C. § 371 of International Application No. PCT/CN2021/095047, filed on May 21, 2021, which claims priority of Chinese Patent Application No. 202010528055.5 filed with the China National Intellectual Property Administration (CNIPA) on Jun. 10, 2020, and entitled "DISPLAY SUBSTRATE, FABRICATION METHOD THEREFOR, AND DISPLAY APPARATUS", the entire content of which is incorporated herein by reference.

FIELD

The present disclosure relates to the technical field of display, in particular to a display substrate, a method for preparing the display substrate, and a display apparatus.

BACKGROUND

Compared with a liquid crystal display (LCD), an organic light-emitting diode (OLED) has the advantages of self-luminance, fast response, wide viewing angle, high brightness, bright colors, less weight and small thickness, and is considered as a display technology of the next generation.

A film forming manner of the organic light-emitting diode is mainly divided into an evaporation process or a solution process. The solution process includes inkjet printing, nozzle coating, spin-coating, silk screen printing, etc. An inkjet printing technology is considered as a major manner for realizing mass production of the organic light-emitting diodes due to high material utilization rate and the capability of realizing large sizes.

SUMMARY

In a first aspect, embodiments of the present disclosure provide a display substrate. The display substrate has a plurality of sub-pixels of at least three colors. The plurality of sub-pixels are arranged into a plurality of rows of pixels in a first direction. The sub-pixels of respective colors in each row of pixels are circularly arranged according to a set sequence. The plurality of rows of pixels are sequentially arranged in a second direction. The first direction and the second direction intersect with each other.

The display substrate includes: a base substrate; a pixel defining layer; and an organic light-emitting functional layer.

The pixel defining layer is located on the base substrate and includes: a plurality of openings that are located in the sub-pixels respectively; and communication slots. At least a portion of the communication slots are located in gaps between adjacent rows of pixels. In at least one row of pixels, openings of sub-pixels of the same color communicate with one another through corresponding communication slots.

The organic light-emitting functional layer is located in the openings corresponding to the sub-pixels.

In one possible implementation, in the above display substrate provided by the embodiments of the present disclosure, the communication slots include first communication slots and second communication slots.

The first communication slots are located in the gaps between adjacent rows of pixels.

The second communication slots connect the first communication slots and the openings, and the second communication slots are located at edges of the openings close to sides of the first communication slots.

In one possible implementation, in the above display substrate provided by the embodiments of the present disclosure, in a row of pixels, the sub-pixels include a plurality of first sub-pixels of a same color, and the openings of the first sub-pixels are connected with corresponding communication slots on a same side of the row of pixels.

In one possible implementation, in the above display substrate provided by the embodiments of the present disclosure, in the row of pixels, the sub-pixels further include a plurality of second sub-pixels of a same color, and the openings of the second sub-pixels are connected with corresponding communication slots on a same side of the row of pixels.

The communication slots corresponding to the first sub-pixels and the communication slots corresponding to the second sub-pixels are located on different sides of the row of pixels.

In one possible implementation, in the above display substrate provided by the embodiments of the present disclosure, in the row of pixels, the sub-pixels further include a plurality of third sub-pixels of a same color.

The row of pixels includes a plurality of pixel units arranged in the first direction, and each first sub-pixel, second sub-pixel and third sub-pixel adjacent to one another constitute one pixel unit.

The pixel unit is rectangular and includes a first side edge and a second side edge which extend in the first direction. In the pixel unit, an edge of the first sub-pixel coincides with the first side edge, an edge of the second sub-pixel coincides with the second side edge, and the third sub-pixel is arranged around the first sub-pixel and the second sub-pixel.

In the row of pixels, groove structures are provided between adjacent pixel units, and the openings of the third sub-pixels in the row of pixels communicate with one another through the groove structures.

In one possible implementation, in the above display substrate provided by the embodiments of the present disclosure, two rows of pixels on two sides of any one gap are symmetrically arranged relative to the gap.

The communication slots connect openings corresponding to the sub-pixels of the same color in every two adjacent rows of pixels.

In one possible implementation, in the above display substrate provided by the embodiments of the present disclosure, in the second direction, either a width of the first sub-pixel or a width of the second sub-pixel is smaller than a width of the pixel unit.

In one possible implementation, in the above display substrate provided by the embodiments of the present disclosure, the first sub-pixels are red sub-pixels, the second sub-pixels are green sub-pixels and the third sub-pixels are blue sub-pixels.

Areas of the third sub-pixels are larger than areas of the first sub-pixels, and the areas of third sub-pixels are larger than areas of the second sub-pixels.

In one possible implementation, in the above display substrate provided by the embodiments of the present disclosure, the first communication slots penetrate through the pixel defining layer in a thickness direction, and a distance between an inner bottom face of a second communication slot and a surface of a side of the pixel defining layer close to the base substrate is larger than zero and is smaller than a maximum thickness of the pixel defining layer.

The inner bottom face of the second communication slot has a lyophilic property.

A surface, in addition to the second communication slots, of a side of the pixel defining layer facing away from the base substrate has lyophobicity.

In one possible implementation, in the above display substrate provided by the embodiments of the present disclosure, a distance between an inner bottom face of a groove structure and a surface of a side of the pixel defining layer close to the base substrate is larger than zero and is smaller than a maximum thickness of the pixel defining layer.

The inner bottom face of the groove structure has a lyophilic property.

In a second aspect, embodiments of the present disclosure further provide a method for preparing the above display substrate, including:

forming a pixel defining layer on a base substrate, and patterning the pixel defining layer to form a plurality of openings and communication slots; and adopting an inkjet printing technique to form an organic light-emitting functional layer in the plurality of openings.

In one possible implementation, in the above method provided by the embodiments of the present disclosure, the forming the pixel defining layer on the base substrate, and patterning the pixel defining layer to form the plurality of openings and communication slots include:

adopting a lyophobic material to form the pixel defining layer on the base substrate; and adopting a halftone mask to pattern the pixel defining layer to obtain the openings, first communication slots penetrating through the pixel defining layer in a thickness direction, and second communication slots and groove structures whose inner bottom faces have a lyophilic property.

In a third aspect, embodiments of the present disclosure further provide a display apparatus, including: the above display substrate provided by the embodiments of the present disclosure.

DETAILED DESCRIPTION OF THE EMBODIMENTS

When an inkjet printing technique is adopted, a pixel defining layer (PDL) needs to be pre-prepared for limiting ink droplets to accurately flow into dedicated sub-pixels. In an inkjet printing process, an inkjet printing device drops the ink droplets into the pixel defining layer through nozzles. However, because errors in inkjet amount among the nozzles, an organic film layer formed in the sub-pixels has non-uniform thickness, resulting in poor uniformity of brightness of an organic light-emitting diode.

For the problem of poor uniformity of brightness of the organic light-emitting diode, embodiments of the present disclosure provide a display substrate, a method for preparing the display substrate, and a display apparatus.

Implementations of the display substrate, the method for preparing the display substrate, and the display apparatus will be described in detail in combination with the accompanying drawings. Thicknesses and shapes of film layers in the accompanying drawings do not reflect true scales, but are merely for illustrating contents of the present disclosure.

Figure 1:
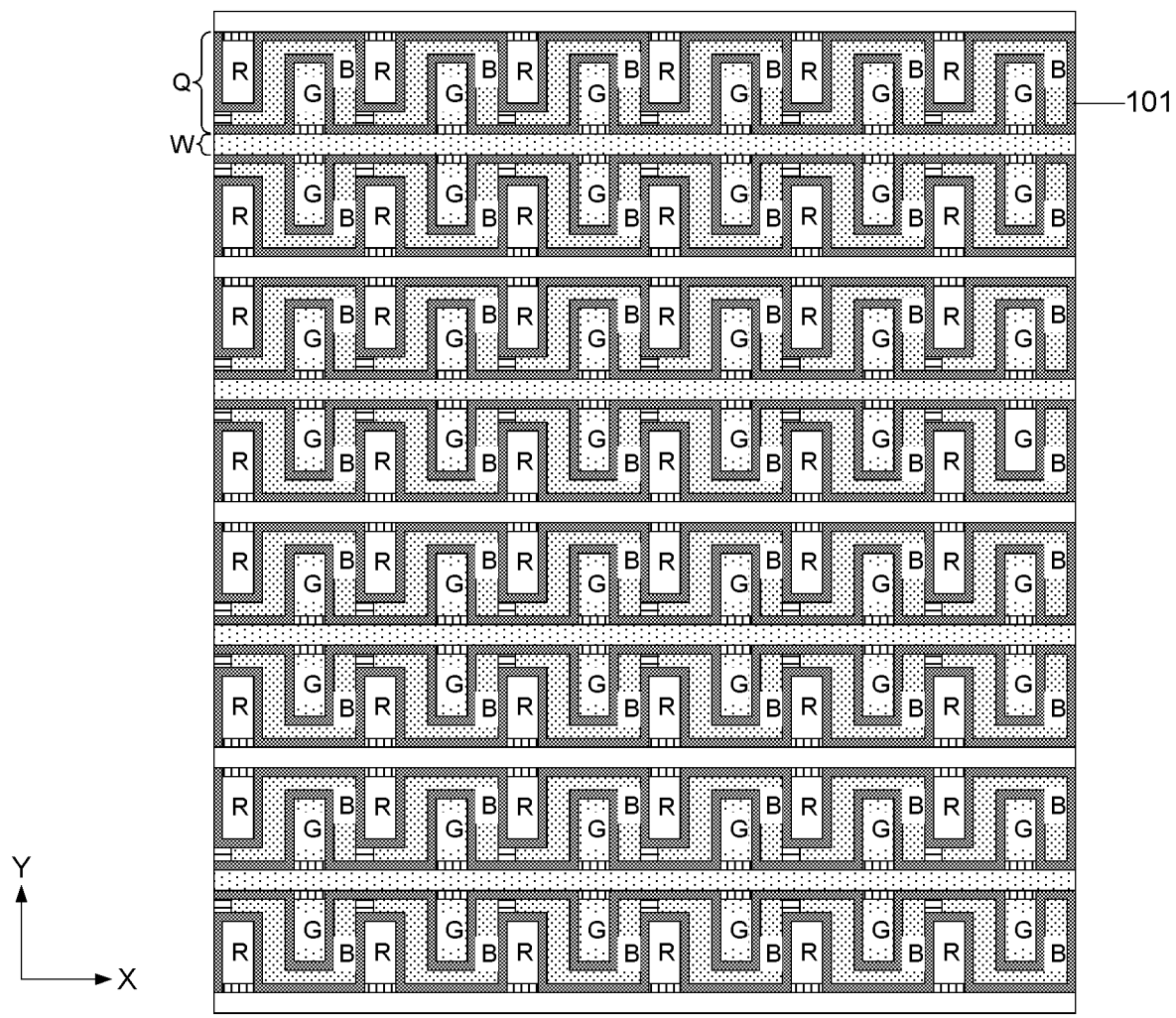
FIG. 1 is a schematic top view of a display substrate provided by an embodiment of the present disclosure.
Figure 2:
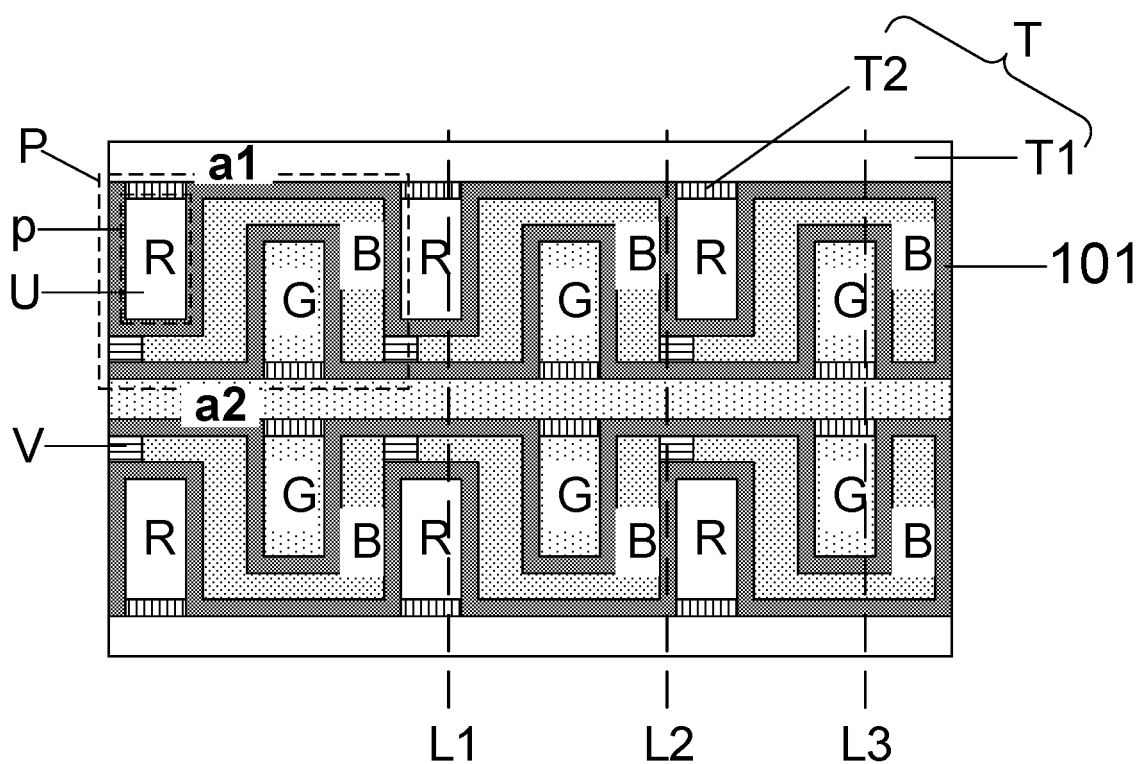
FIG. 2 is a locally-enlarged schematic diagram of FIG. 1.

FIG. 1 is a schematic top view of a display substrate provided by an embodiment of the present disclosure, and FIG. 2 is a locally-enlarged schematic diagram of FIG. 1. The display substrate provided by the embodiments of the present disclosure, as shown in FIG. 1 and FIG. 2, has a plurality of sub-pixels p of at least three colors, which are illustrated by taking the display substrate including sub-pixels of three colors such as red, green, and blue in the drawings as an example. The plurality of sub-pixels are arranged into a plurality of rows of pixels Q in a first direction X. The sub-pixels p of respective colors in each row of pixels Q are circularly arranged according to a set sequence. The plurality of rows of pixels Q are sequentially arranged in a second direction Y. The first direction X and the second direction Y intersect with each other.

Figure 3:
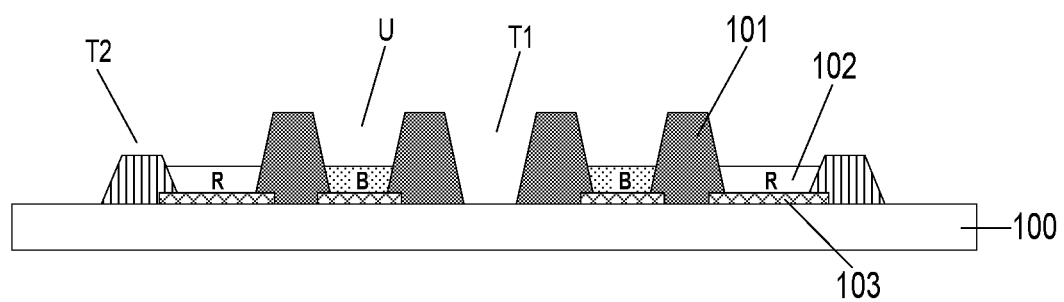
FIG. 3 is a schematic diagram of a section at a dotted line L1 in FIG. 2.
Figure 4:
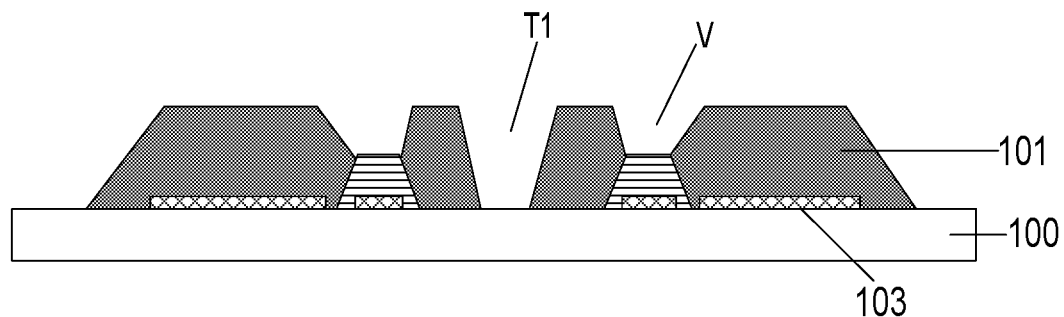
FIG. 4 is a schematic diagram of a section at a dotted line L2 in FIG. 2.
Figure 5:
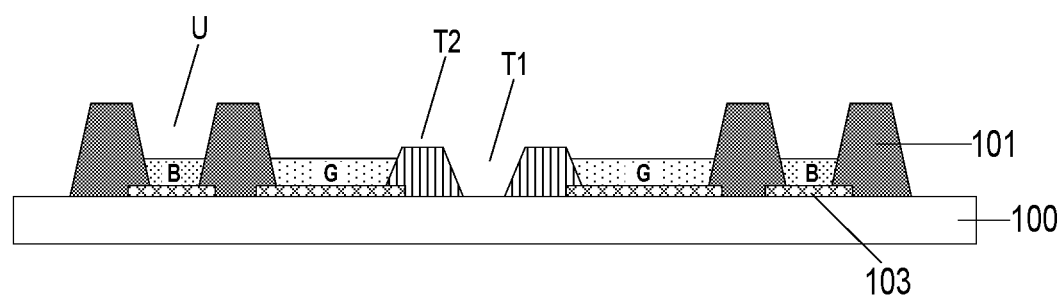
FIG. 5 is a schematic diagram of a section at a dotted line L3 in FIG. 2.

FIG. 3 is a schematic diagram of a section at a dotted line L1 in FIG. 2, FIG. 4 is a schematic diagram of a section at a dotted line L2 in FIG. 2, and FIG. 5 is a schematic diagram of a section at a dotted line L3 in FIG. 2.

Referring to FIG. 3 to FIG. 5, the display substrate includes: a base substrate 100, a pixel defining layer 101 on the base substrate 100, and an organic light-emitting functional layer 102.

The pixel defining layer 101 includes: a plurality of openings U that are located in the sub-pixels p respectively and communication slots T. The organic light-emitting functional layer 102 corresponding to the sub-pixels p is provided in the openings U.

In at least one row of pixels Q, the openings U of sub-pixels p of the same color communicate with one another through the corresponding communication slots T, and at least a portion of the communication slots T are located in gaps W between adjacent rows of pixels Q.

According to the display substrate provided by the embodiments of the present disclosure, by arranging the communication slots in the pixel defining layer, in the at least one row of pixels, the openings of the sub-pixels of the same color communicate with one another through the communication slots. Therefore, in an inkjet printing process, ink droplets sprayed by different nozzles may flow among the openings communicating with one another through the communication slots, defects caused by errors of inkjet amount among different nozzles may be overcome, uniformity of a thickness of an organic film layer formed by an inkjet printing technique is improved, and uniformity of brightness of an organic light-emitting diode is thereby improved.

In the embodiments of the present disclosure, the display substrate may be an organic electroluminescent display substrate. Referring to FIG. 3, the display substrate may further include a plurality of first electrodes 103. The plurality of first electrodes 103 are in one-to-one correspondence to the plurality of openings U in the pixel defining layer 101, the corresponding first electrodes 103 may be exposed through the openings U, so that the organic light-emitting functional layer 102 may be in contact with the first electrodes 103, thereby enabling the first electrodes 103 to provide carriers for the organic light-emitting functional layer 102. In addition, the above display substrate may further include second electrodes not shown in the drawing. The second electrodes may cover the organic light-emitting functional layer, and carriers are provided for the organic light-emitting functional layer through the first electrodes and the second electrodes respectively, so that light emission of the organic light-emitting functional layer is controlled. For example, the first electrodes are anodes and the second electrodes are cathodes; or the first electrodes are cathodes, and the second electrodes are anodes, which is not limited here.

For example, the above organic light-emitting layer may include organic film layers such as a light-emitting layer, a hole injection layer, a hole transport layer, an electrode injection layer, and an electrode transport layer.

In a practical technical process, the organic light-emitting functional layer 102 of the sub-pixels p of the same color may be made of the same material. In the embodiments of the present disclosure, by arranging the communication slots for the openings of the sub-pixels of the same color to communicate with one another, in the inkjet printing process, ink may flow in connected communication slots and openings, so that a phenomenon of non-uniform film forming caused by difference in inkjet amount among the nozzles may be avoided, thereby improving the uniformity of the thickness of the organic film layer. In addition, light-emitting layers of sub-pixels of different colors are prepared by ink of different colors, so that the light-emitting layers of the sub-pixels of different colors may be separately subjected to the inkjet printing technique.

During specific implementation, in the inkjet printing process, if there are particles in the sub-pixels, because of an effect of surface tension of the ink, the particles generate tensile force on the surrounding ink, so a large amount of ink is absorbed close to the particles, there is less ink at other locations, and therefore the uniformity of the formed organic film layer is relatively poor. In the embodiments of the present disclosure, in the at least one row of pixels, the openings of the sub-pixels of the same color communicate with one another through the communication slots, and at least a portion of the communication slots are located in the gaps between the adjacent rows of pixels, so that the sub-pixels of the same color in the same row of pixels communicate with one another through the bent communication slots. Therefore, liquidity of the ink among the sub-pixels of the same color in the same row of pixels may be reduced, the surface tension of the ink is weakened, and the tensile force of the particles in the sub-pixels on the ink may be lowered, thereby improving the uniformity of film forming of the inkjet printing technique.

It should be noted that, in the drawings of the embodiments of the present disclosure, illustrating based on the sub-pixels of a limited quantity does not limit the quantity of the sub-pixels. In addition, in the embodiments of the present disclosure, describing by taking the sub-pixels of the three colors including red, green and blue does not limit colors of the sub-pixels. During specific implementations, the sub-pixels may also be other colors, which is not limited here. Further, the quantity of the sub-pixels in the above display substrate is definitely limited. That is, the above display substrate definitely includes a first row of pixels and a last row of pixels. Referring to FIG. 1, communication slots may also be arranged on an upper side of the first row of pixels and a lower side of the last row of pixels. Or it may be understood as, the upper side of the first row of pixels and the lower side of the last row of pixels both belong to the gaps between adjacent rows of pixels.

In the above display substrate provided by the embodiments of the present disclosure, as shown in FIG. 1 and FIG. 2, the communication slots T include first communication slots T1 and second communication slots T2.

The first communication slots T1 are located in the gaps W between adjacent rows of pixels Q.

The second communication slots T2 connect the first communication slots T1 and the openings U, and the second communication slots T2 are located at edges of the openings U close to sides of the first communication slots T1.

Through the arrangement of the first communication slots T1 and the second communication slots T2, a portion of the communication slots T may be located in the gaps W between adjacent rows of pixels Q, and by arranging the second communication slots T2 at the edges of the openings U close to the sides of the first communication slots T1, the first communication slots T1 may conveniently communicate with the second communication slots T2, thereby realizing communication between the first communication slots T1 and the openings U.

During implementations, in the above display substrate provided by the embodiments of the present disclosure, as shown in FIG. 1 and FIG. 2, in the row of pixels Q, the sub-pixels p include a plurality of first sub-pixels of the same color, and the openings U of the first sub-pixels are connected with the corresponding communication slots T on the same side of the row of pixels Q. That is, the plurality of sub-pixels of the same color in one row of pixels Q may communicate with one another through the communication slots T. To take the first sub-pixels being red R as an example, in a first row of pixels Q in FIG. 1, the openings U of the first sub-pixels communicate with the communication slots T on the upper side.

Optionally, in the above display substrate provided by the embodiments of the present disclosure, referring to FIG. 1 and FIG. 2, in the row of pixels Q, the sub-pixels p further include a plurality of second sub-pixels of the same color, and the openings U of the second sub-pixels are connected with the corresponding communication slots T on the same side of the row of pixels Q.

The communication slots T corresponding to the first sub-pixels and the communication slots T corresponding to the second sub-pixels are located on different sides of the row of pixels Q.

To take the second sub-pixels being green G as an example, in the first row of pixels Q in FIG. 1, the red sub-pixels communicate with the communication slots T on the upper side of the row of pixels Q, and the green sub-pixels communicate with the communication slots T on the lower side of the row of pixels Q, so that the sub-pixels of two colors in the row of pixels Q may be respectively connected to the communication slots, thus ensuring that the sub-pixels of at least two colors have an organic film layer with relatively good uniformity.

Further, in the above display substrate provided by the embodiments of the present disclosure, as shown in FIG. 1 and FIG. 2, in the row of pixels Q, the sub-pixels p further include a plurality of third sub-pixels of the same color.

The row of pixels Q include a plurality of pixel units P arranged in the first direction X, and each first sub-pixel, second sub-pixel and third sub-pixel adjacent to one another constitute one pixel unit P.

The pixel unit P is rectangular, and includes a first side edge a1 and a second side edge a2 which extend in the first direction X; and in each pixel unit P, an edge of the first sub-pixel (for example, a sub-pixel p of a color red R) coincides with the first side edge a1, an edge of the second sub-pixel (for example, a sub-pixel p of a color green G) coincides with the second side edge a2, and the third sub-pixel (for example, a sub-pixels of a color blue B) is arranged around the first sub-pixel and the second sub-pixel.

In the row of pixels Q, groove structures V are provided between every two adjacent pixel units P, and the openings of the third sub-pixels in the row of pixels Q communicate with one another through the groove structures V.

In the embodiments of the present disclosure, the row of pixels Q includes the plurality of pixel units P arranged in the first direction X, the pixel unit P includes the first sub-pixel, the second sub-pixel and the third sub-pixel which are of different colors, and the pixel units P are sequentially arranged in the first direction X. For example, the edge of the first sub-pixel coincides with the first side edge a1, the edge of the second sub-pixel coincides with the first side edge a2, and a region in the pixel unit P in addition to the first sub-pixel and the second sub-pixel is the third sub-pixel. Either a width of the first sub-pixel or a width of the second sub-pixel in the second direction Y is smaller than a width of the pixel unit P, so the third sub-pixel is arranged around the first sub-pixel and the second sub-pixel and the third sub-pixel is in a through shape. As shown in FIG. 2, the third sub-pixel is shaped like a square wave. In the row of pixels Q, the openings of the third sub-pixels communicate with one another through the groove structures V. As shown in FIG. 1, the communicating third sub-pixels in the row of pixels Q are in a bent line shape as a whole, so liquidity of ink among the third sub-pixels in the row of pixels Q may be reduced, the surface tension of the ink is weakened, and the tensile force of particles in the third sub-pixels on the ink may be lowered, thereby improving the uniformity of film forming of the inkjet printing technique.

In the embodiments of the present disclosure, description is made by taking the pixel unit P being rectangular as an example. During specific implementation, the pixel unit P may also be in other shapes, such as parallelogram and trapezoid, and the shape of the pixel unit P is not limited herein.

During implementations, in the above display substrate provided by the embodiments of the present disclosure, as shown in FIG. 1, two rows of pixels Q on two sides of any one gap W are symmetrically arranged relative to the gap Q.

The communication slots T connect openings U corresponding to the sub-pixels p of the same color in every two adjacent rows of pixels Q.

In the row of pixels Q, the communication slots T corresponding to the first sub-pixels and the communication slots T corresponding to the second sub-pixels are located on different sides of the row of pixels Q. Two rows of pixels Q on two sides of the gap W are symmetrically arranged relative to the gap W, so the sub-pixels p of the same color in every two adjacent rows of pixels Q are close to the same gap W and the communication slots T may connect the openings U corresponding to the sub-pixels p of the same color in the two adjacent rows of pixels Q. As shown in FIG. 1, the openings U of green sub-pixels p in the first row of pixels Q and the second row of pixels Q are connected with the same communication slots, the openings U of red sub-pixels p in the second row of pixels Q and the third row of pixels Q are connected with the same communication slots, and so on. The colors corresponding to the communication slots T in adjacent gaps W are different.

In this way, in the inkjet printing process, a flowing range of the ink is larger, which is conducive to overcoming the defect caused by the errors of inkjet amount among different nozzles, and only two sub-pixels of the same color communicate with each other through the gap W in the second direction, so the surface tension of the ink will not be increased and the tensile force of the particles on the ink will not be increased.

In addition, in order to avoid increase of the surface tension of the ink, two adjacent rows of pixels Q may also be arranged staggered in the first direction X, for example, the two adjacent rows of pixels Q may be arranged staggered by half a width of a first sub-pixel on the first direction X. That is, the two adjacent rows of pixels Q may also be asymmetrically arranged. During specific implementation, a dislocation width between the two adjacent rows of pixels Q may be arranged according to practical needs.

Optionally, in the above display substrate provided by the embodiments of the present disclosure, as shown in FIG. 2, the first sub-pixels are red sub-pixels, the second sub-pixels are green sub-pixels, and the third sub-pixels are blue sub-pixels.

Areas of the third sub-pixels are larger than areas of the first sub-pixels, and the areas of third sub-pixels are larger than areas of the second sub-pixels.

Normally, a service life of a light-emitting layer material of the blue sub-pixels is relatively short, and by arranging the areas of the blue sub-pixels to be larger, a problem of color cast caused by different decay speeds of light-emitting layer materials of different colors may be solved.

Figure 6:
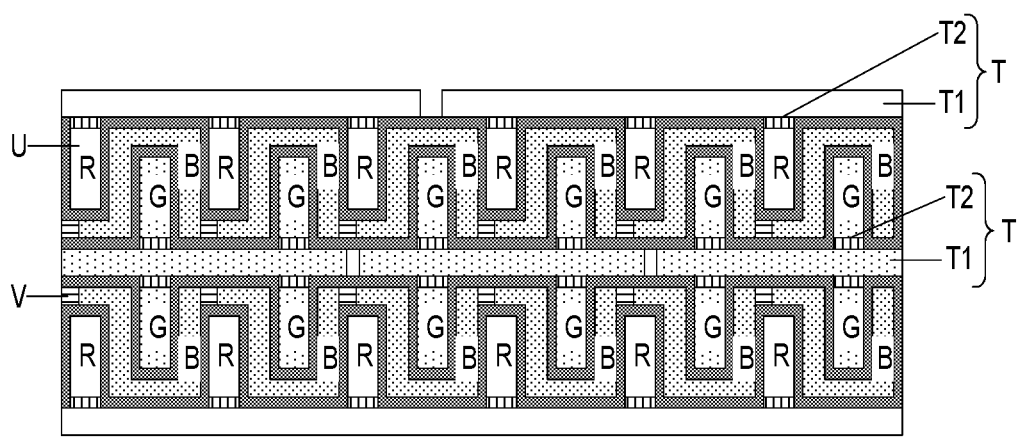
FIG. 6 is another schematic top view of a display substrate provided by an embodiment of the present disclosure.

In addition, in the embodiments of the present disclosure, as shown in FIG. 6, in the row of pixels Q, the sub-pixels p of the same color may also be connected to at least two communication slots T. For example, in FIG. 6, in the first row of pixels Q, three red sub-pixels on the left are connected to one communication slot T, and three red sub-pixels on the right are connected to another communication slot T.

Specifically, in the above display substrate provided by the embodiments of the present disclosure, as shown in FIG. 3, the first communication slot T1 penetrates through the pixel defining layer 101 in a thickness direction, and a distance between an inner bottom face of the second communication slot T2 and a surface of a side of the pixel defining layer 101 close to the base substrate 100 is larger than zero and is smaller than a maximum thickness of the pixel defining layer 101.

The inner bottom face of the second communication slot T2 has a lyophilic property.

A surface, in addition to the second communication slots T2, of a side of the pixel defining layer 101 facing away from the base substrate 100 has lyophobicity.

During implementations, the first electrodes 103 are located at the sub-pixels, the second communication slot T2 does not penetrate through the pixel defining layer 101, and an effect of covering the first electrodes 103 on a lower layer may be achieved, so a phenomenon of electric leakage is prevented. In addition, a film layer under the pixel defining layer 101 at the gaps is a planarization layer, so the phenomenon of electric leakage will not be caused when the first communication slots T1 located among the gaps are arranged to penetrate through the pixel defining layer 101. Further, the first communication slots T1 may also be a concave shape not penetrating through the pixel defining layer 101, which is not limited here.

The inner bottom face of each second communication slot T2 is arranged to be lyophilic, so the ink can flow in the communication slots T, and when the first communication slots T1 are arranged to be concave, the inner bottom faces of the first communication slots T1 may also be arranged to be lyophilic.

The surface, in addition to the second communication slots T2, of the side of the pixel defining layer 101 facing away from the base substrate 100 has lyophobicity, so the ink droplets may be prevented from flowing onto the surface of the pixel defining layer 101. In addition, when the pixel defining layer further includes the groove structures, the surface of the pixel defining layer in addition to the first communication slots and the groove structures is lyophobic.

Specifically, in the above display substrate provided by the embodiments of the present disclosure, as shown in FIG. 2, a distance between an inner bottom face of each groove structure V and the surface of the side of the pixel defining layer 101 close to the base substrate 100 is larger than zero and is smaller than a maximum thickness of the pixel defining layer 101.

The inner bottom faces of the groove structures V have a lyophilic property.

The groove structures V are arranged to not penetrate through the pixel defining layer 101, and the effect of covering the first electrodes 103 on the lower layer may be achieved, so the phenomenon of electric leakage is avoided. During implementations, a depth of the groove structure V may be consistent with a depth of the second communication slot T2. Therefore, in an implementation process, a same pattern technique may be adopted to form the groove structures V and the second communication slots T2. Further, the inner bottom faces of the groove structures V are arranged to be lyophilic, so the ink can flow among the openings which communicate with one another through the groove structures V.

For example, in the embodiments of the present disclosure, the maximum thickness of the pixel defining layer may be about 1.5 μm, the distance between the inner bottom face of the second communication slot and the surface of the side of the pixel defining layer close to the base substrate may be smaller than or equal to 1 μm, and the distance between the inner bottom face of the groove structure and the surface of the side of the pixel defining layer close to the base substrate may be smaller than or equal to 1 μm.

Based on the same inventive concept, embodiments of the present disclosure further provide a method for preparing the above display substrate. Because a problem solving principle of the method is similar to that of the display substrate, for implementation of the method, reference may be made to implementation of the above display substrate, and repetition will not be made.

Figure 7:
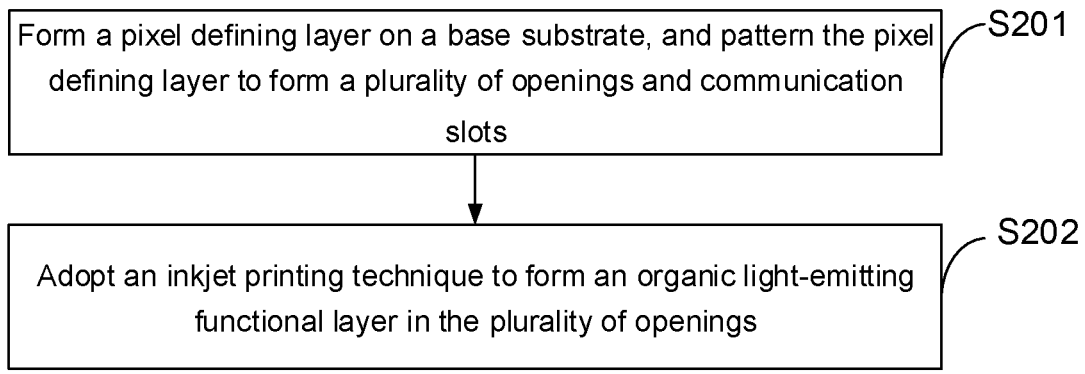
FIG. 7 is a flow chart of a method for preparing a display substrate provided by an embodiment of the present disclosure.

The method for preparing the above display substrate provided by the embodiments of the present disclosure, as shown in FIG. 7, includes the following steps.

S201, a pixel defining layer is formed on a base substrate, and the pixel defining layer is patterned to form a plurality of openings and communication slots.

S202, an inkjet printing technique is adopted to form an organic light-emitting functional layer in the plurality of openings.

According to the method provided by the embodiments of the present disclosure, by patterning the pixel defining layer, the plurality of openings and communication slots are formed, and openings of sub-pixels of the same color in the same row of pixels may communicate with one another through the communication slots. When inkjet printing technique is adopted to prepare the organic light-emitting functional layer, ink droplets sprayed by different nozzles may flow among the openings communicating with one another through the communication slots, defects caused by errors of inkjet amount among different nozzles may be overcome, uniformity of a thickness of an organic film layer formed by an inkjet printing technique is improved, and uniformity of brightness of an organic light-emitting diode is thereby improved.

Figure 8:
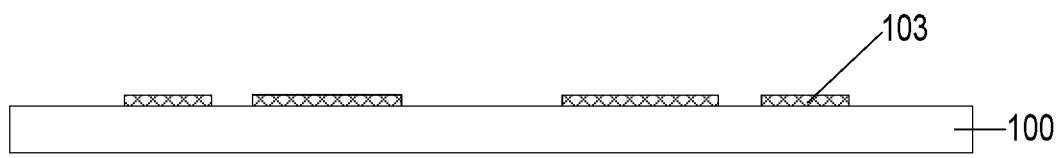
FIG. 8 to FIG. 22 are schematic structural diagrams corresponding to steps in a method for preparing a display substrate provided by an embodiment of the present disclosure.

During implementations, referring to FIG. 8, before the above step S201, the method may further include: a plurality of first electrodes 103 are formed on the base substrate 100. For example, the first electrodes 103 may be prepared by transparent conducting materials such as indium tin oxide, and shapes of the first electrodes 103 may be consistent with shapes of the sub-pixels. In addition to forming the first electrodes, the method may further include forming a driving circuit on the base substrate, and forming a planarization layer on the driving circuit.

In the above method provided by the embodiments of the present disclosure, the above step S201 may include the following.

Figure 9:
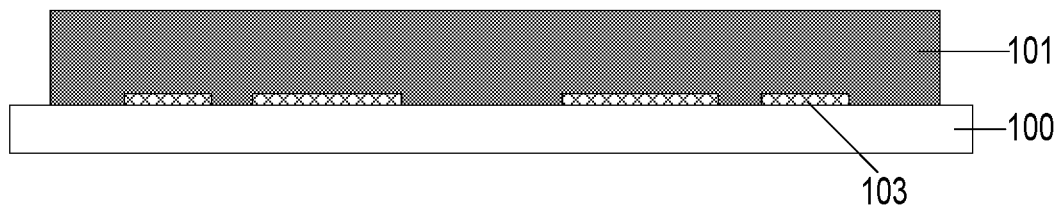

Referring to FIG. 9, a lyophobic material is adopted to form the pixel defining layer 101 on the base substrate 100. For example, a fluorine-doped polyimide material may be adopted to form the pixel defining layer 101.

Figure 10:
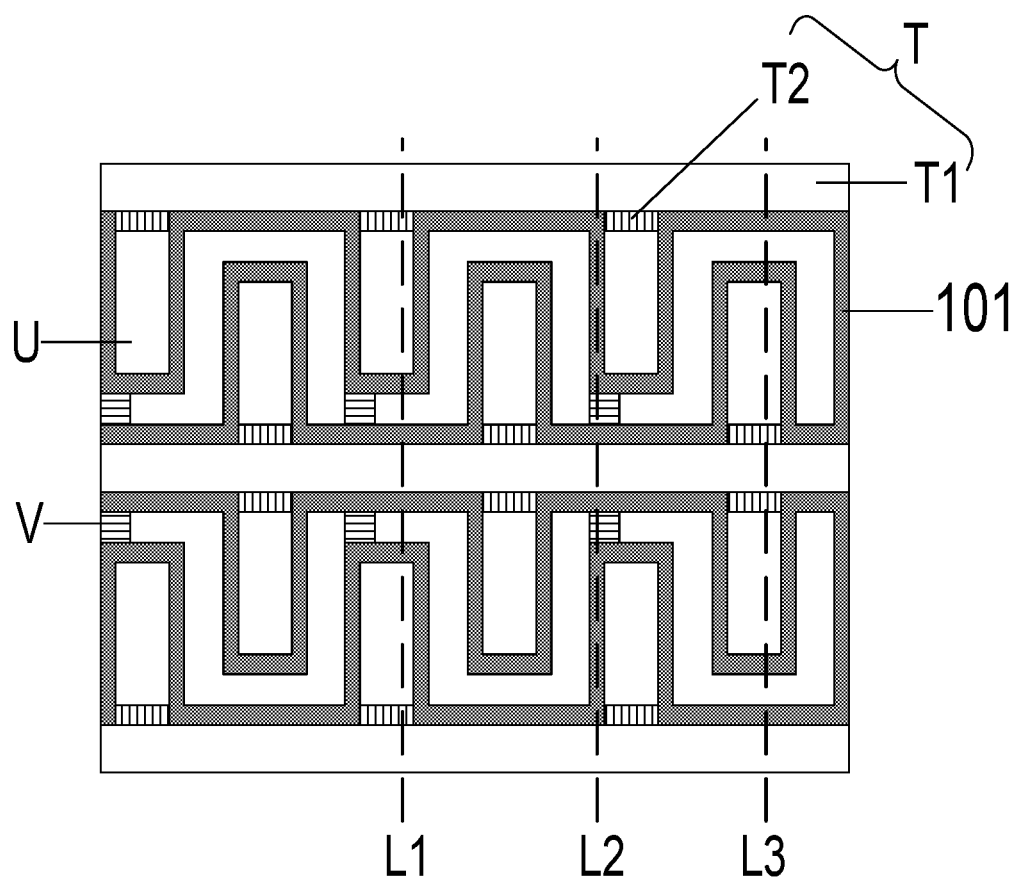
Figure 11:
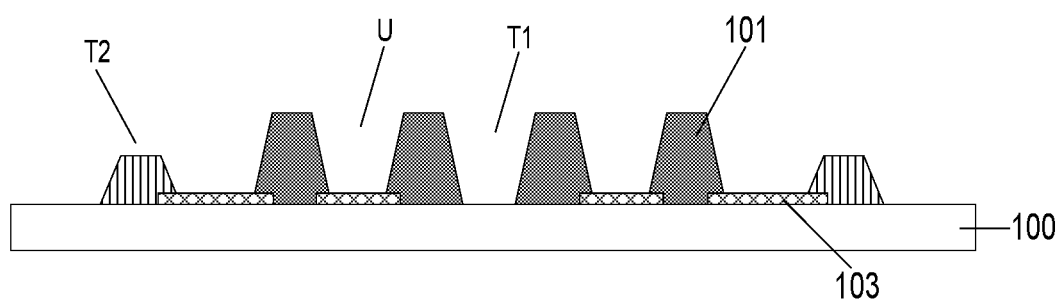
Figure 12:
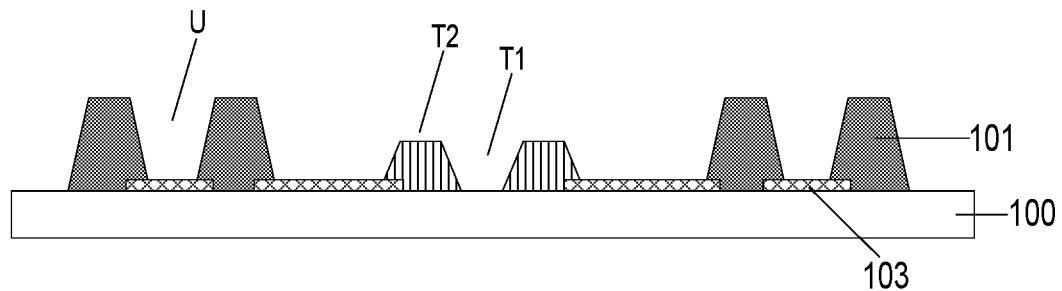

A halftone mask is adopted to pattern the pixel defining layer 101. FIG. 10 is a schematic top view of the patterned pixel defining layer, FIG. 11 is a schematic diagram of a section of FIG. 10 at a dotted line L1, FIG. 12 is a schematic diagram of a section of FIG. 10 at a dotted line L3, and for schematic diagram of a section of FIG. 10 at a dotted line L2, reference may be made to FIG. 4. As shown in FIG. 10, FIG. 11, FIG. 4 and FIG. 12, after patterning the pixel defining layer 101, the openings, first communication slots T1 penetrating through the pixel defining layer 101 in a thickness direction, second communication slots T2 and groove structures V are obtained, and inner bottom faces of the second communication slots T2 and the groove structures V have a lyophilic property.

The halftone mask is adopted to pattern the pixel defining layer 101, and the lyophobic material is usually blended. To take the fluorine-doped polyimide material as an example, lyophobic fluoride in the fluorine-doped polyimide is physically mixed with lyophilic polyimide. After the fluorine-doped polyimide material is coated on the base substrate, the fluoride has low surface energy; and in solvent removal, exposure and other processes, the fluoride will migrate upward and accumulate on a surface of a film layer. Therefore, after a photolithography process is completed, the fluoride accumulated on the surface at the position of the second communication slots and the groove structures will be removed, and the inner bottom faces of the second communication slots T2 and the groove structures V are made of a polyimide material, so that the inner bottom faces of the formed second communication slots T2 and the groove structures V are lyophilic. In this way, the first communication slots T1, the second communication slots T2 and the groove structures V are formed by the same patterning process, which reduces the number of patterning processes and saves the preparing cost, and the formed pixel defining layer 101 is of an integrated structure.

In addition, since a thickness of the second communication slots (or the groove structures) is different from that of the pixel defining layer, a pattern of the pixel defining layer may also be obtained by two patterning processes. For example, in the first patterning process, a lyophilic material (for example, an acrylic material) is used to form the pixel defining layer at the positions of the second communication slots and the groove structures, and the same patterning process is used to form the second communication slots and the groove structures, so one patterning process may be saved, thereby saving the preparing cost. In the second patterning process, a lyophobic material is used to prepare the pixel defining layer outside the positions of the second communication slots and the groove structures. The first composition process can be performed before the second composition process, or the second composition process is performed before the first composition process. The sequence of the first composition process and the second composition process is not limited here.

In the above step S202, film layers in the light-emitting functional layer are prepared by adopting an inkjet printing technique. In the embodiments of the present disclosure, through the arrangement of the communication slots and the groove structures, liquidity of the ink droplets may be relatively large, defects cause by errors of inkjet amount among different nozzles may be overcome, and tensile force of particles in sub-pixels on the ink may be lowered, thereby improving the uniformity of film forming of the inkjet printing technique.

During implementations, light-emitting layers of sub-pixels of different colors are prepared by ink of different colors, so that the light-emitting layers of the sub-pixels of different colors may be separately subjected to the inkjet printing technique. A preparing process of a light-emitting layer of different colors will be described in detail in combination with the accompanying drawings. Further, in the embodiments of the present disclosure, the preparing process of the light-emitting layer is described in a sequence of red, green and blue, and during specific implementation, other sequences may also be adopted, which is not limited herein.

Figure 13:
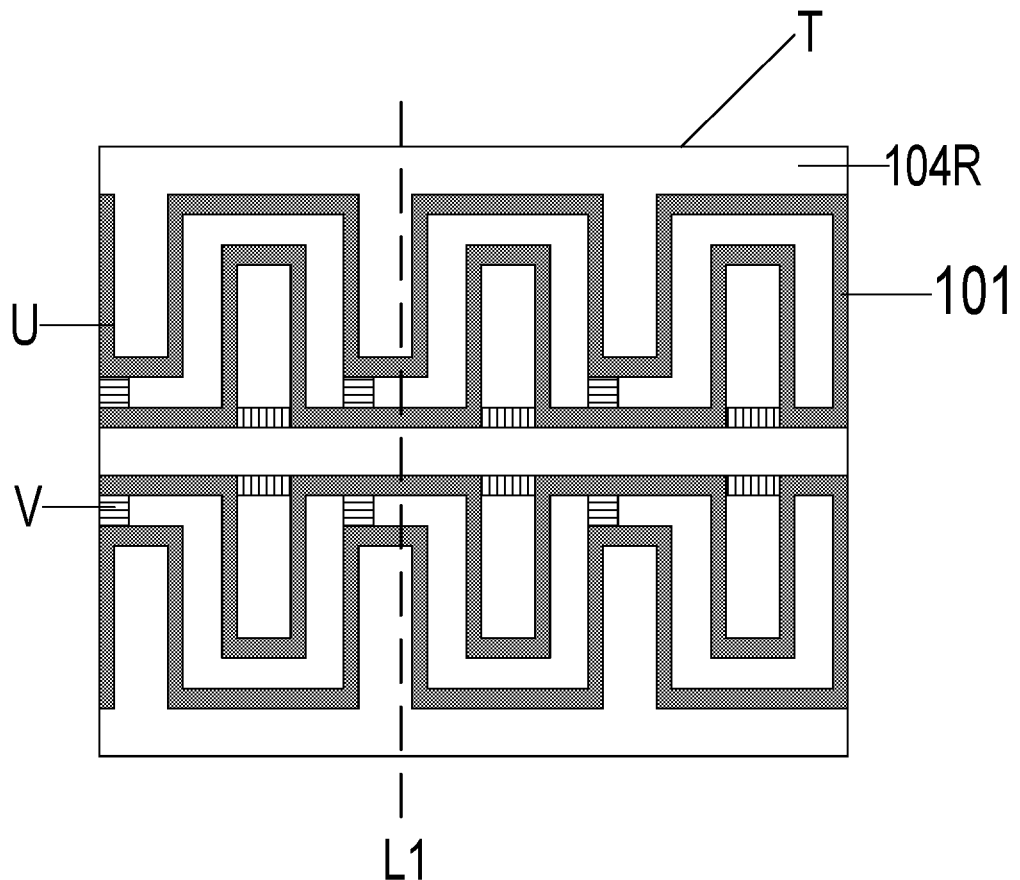
Figure 14:
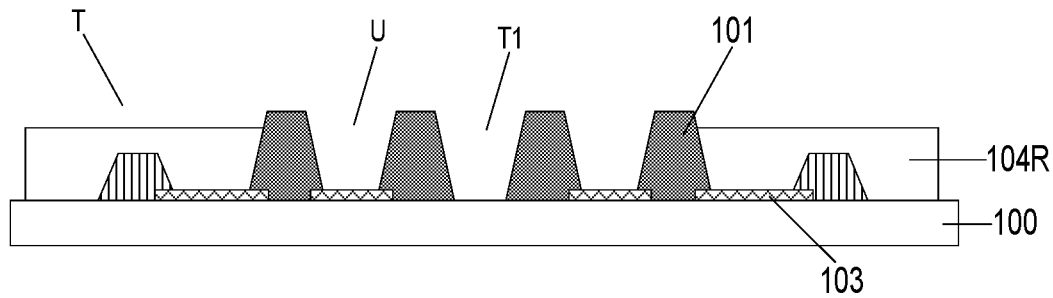
Figure 15:
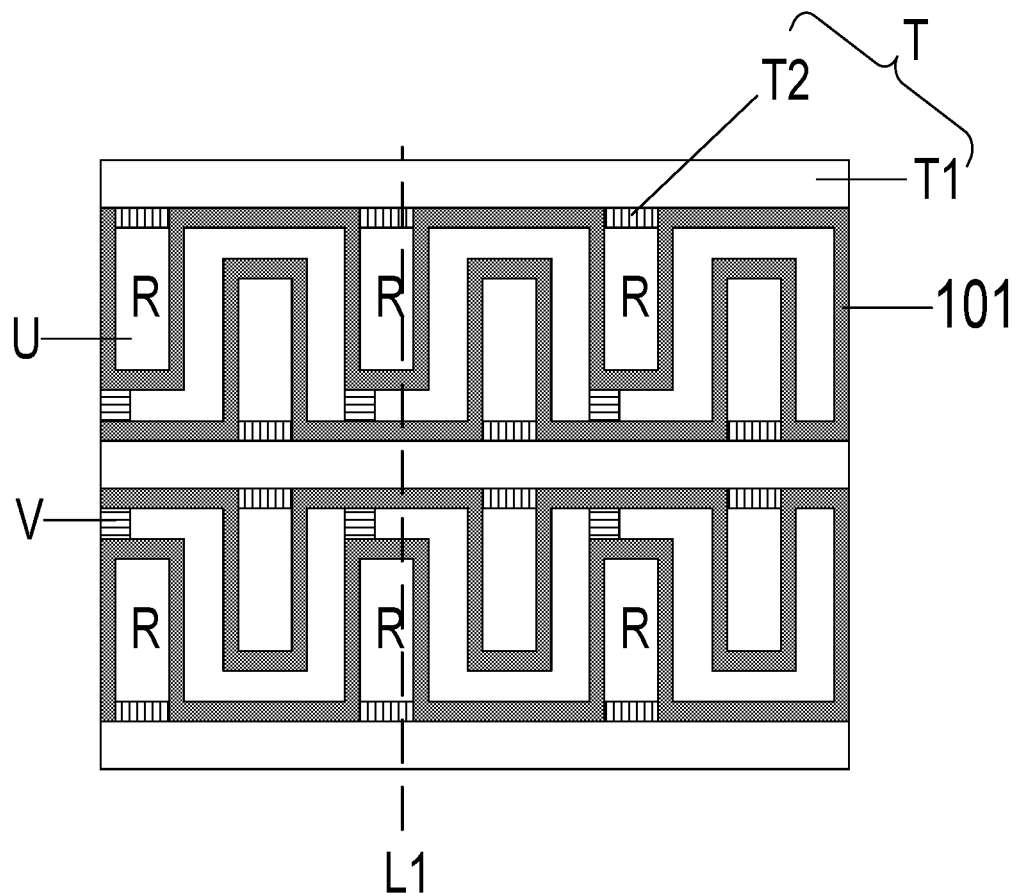
Figure 16:
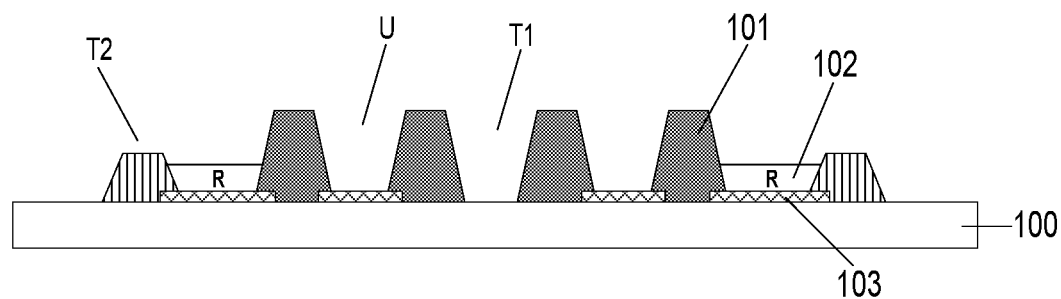

FIG. 14 is a schematic diagram of a section of FIG. 13 at a dotted line L1, and FIG. 16 is a schematic diagram of a section of FIG. 15 at a dotted line L1. As shown in FIG. 13 and FIG. 14, red ink 104R is dripped into the openings U and the communication slots T corresponding to red sub-pixels. Specifically, the ink 104R may be dripped into the openings of the red sub-pixels through nozzles. The ink 104R may flow among the openings U and the communication slots T which communicate with one another, and after a drying film forming technique, a red light-emitting layer as shown in FIG. 15 and FIG. 16 may be obtained.

Figure 17:
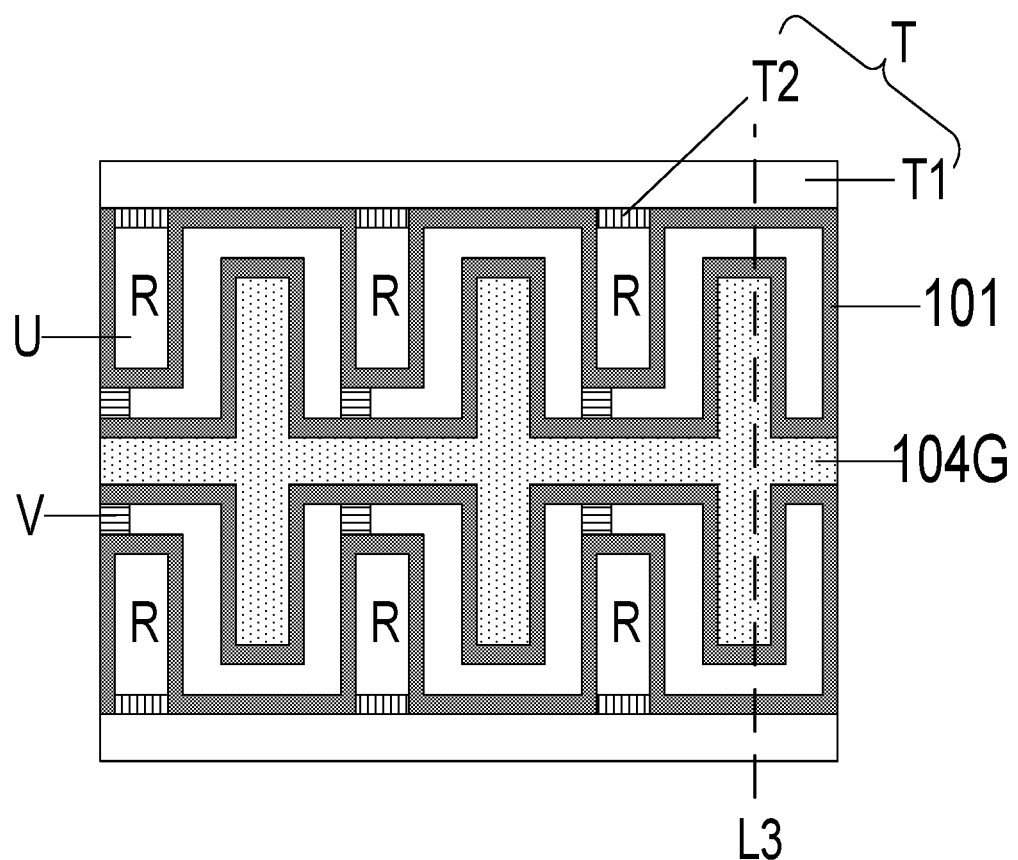
Figure 18:
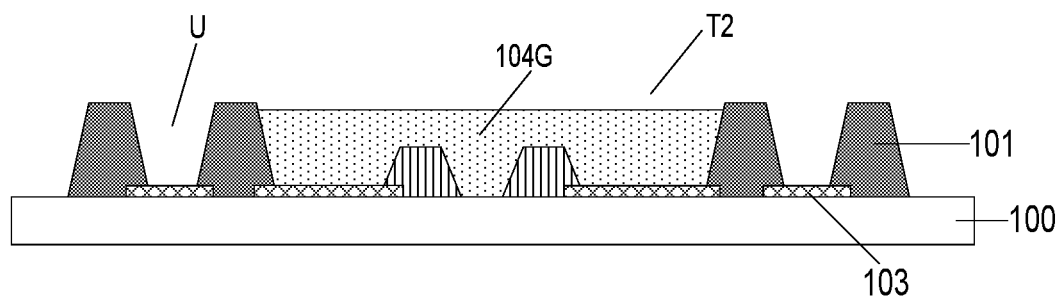
Figure 19:
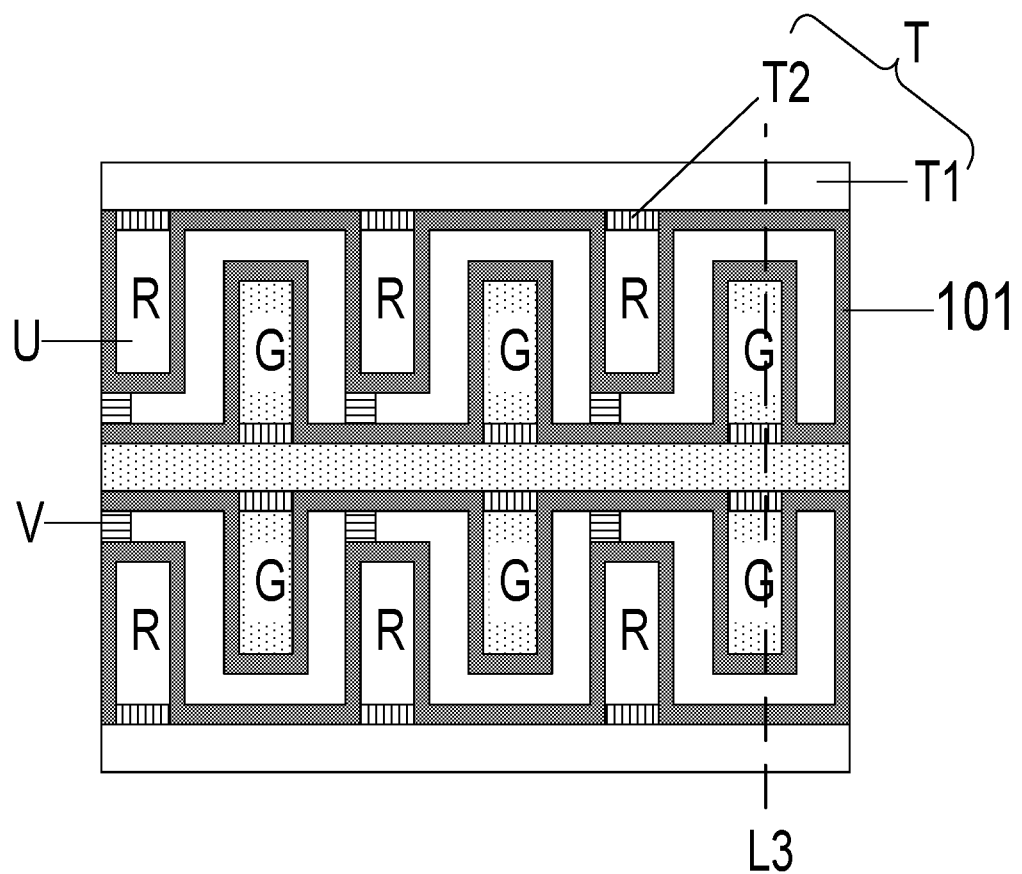
Figure 20:
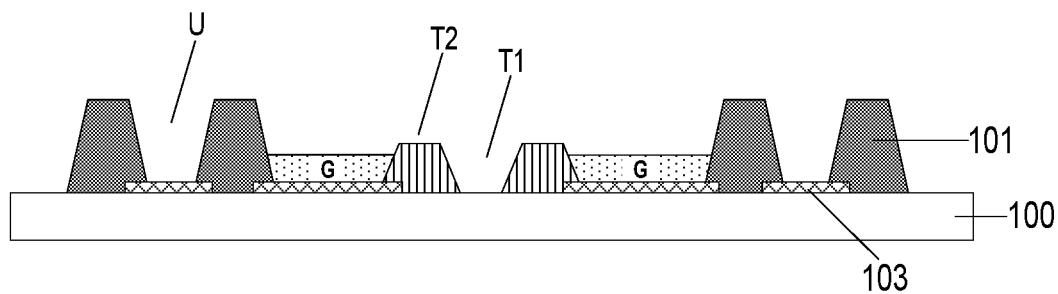

FIG. 18 is a schematic diagram of a section of FIG. 17 at a dotted line L3, and FIG. 20 is a schematic diagram of a section of FIG. 19 at a dotted line L3. As shown in FIG. 17 and FIG. 18, green ink 104G is dripped into the openings U and the communication slots T corresponding to green sub-pixels. Specifically, the ink 104G may be dripped into the openings of the green sub-pixels through nozzles. The ink 104G may flow among the openings U and the communication slots T which communicate with one another, and after a drying film forming technique, a green light-emitting layer as shown in FIG. 19 and FIG. 20 may be obtained.

Figure 21:
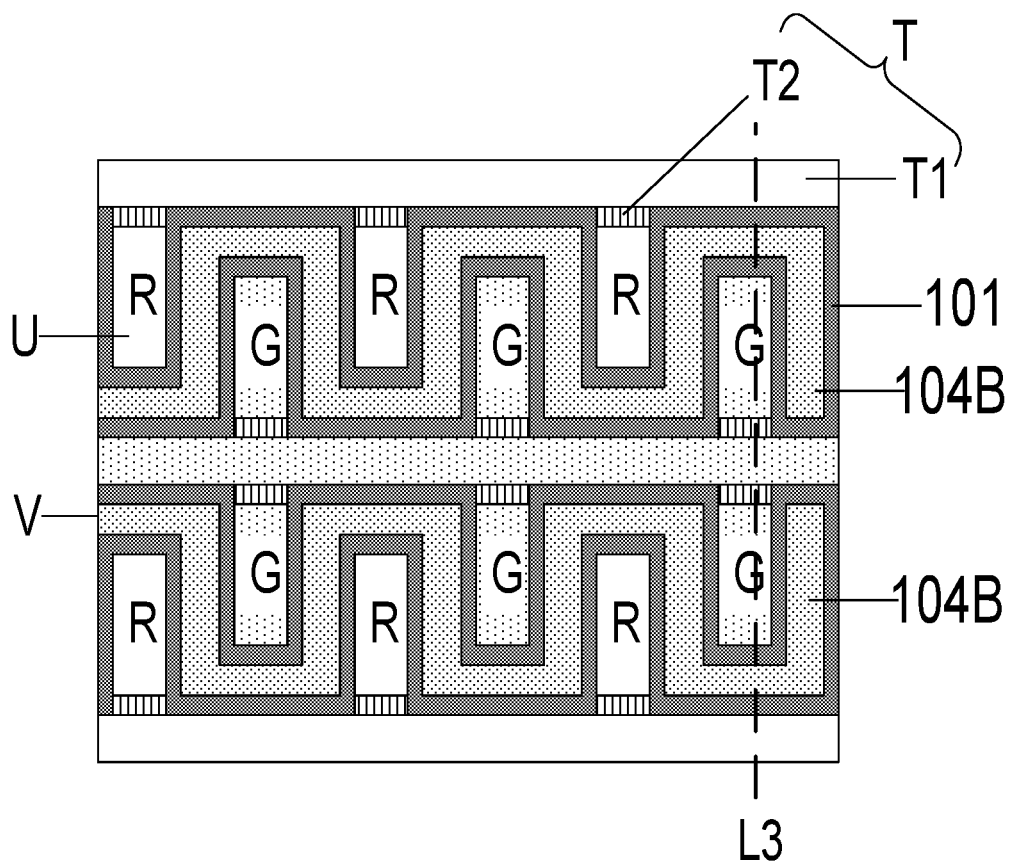
Figure 22:
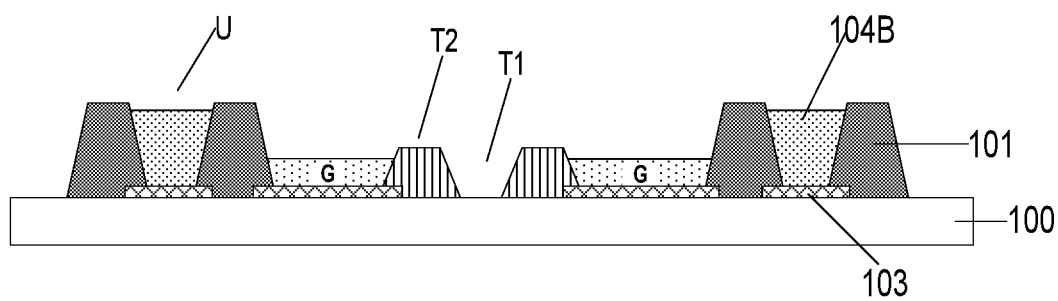

FIG. 22 is a schematic diagram of a section of FIG. 21 at a dotted line L3. As shown in FIG. 21 and FIG. 22, blue ink 104B is dripped into the openings U and the groove structures V corresponding to blue sub-pixels. Specifically, the ink 104B may be dripped into the openings of the blue sub-pixels through nozzles. The ink 104B may flow among the openings U and the groove structures V which communicate with one another, and after a drying film forming technique, a blue light-emitting layer as shown in FIG. 2 and FIG. 5 may be obtained.

During implementations, the inkjet printing technique may also be adopted to form other film layers in the organic light-emitting functional layer, such as a hole injection layer, a hole transport layer, an electron injection layer, and an electron transport layer.

After the organic light-emitting functional layer is formed, an evaporation technique may be adopted to form second electrodes on the organic light-emitting functional layer. The second electrodes may be arranged as a whole layer and then a packaging process is performed.

Based on the same inventive concept, embodiments of the present disclosure further provide a display apparatus, including the above display substrate. The display apparatus may be applied to mobile phones, tablet computers, televisions, monitors, notebook computers, digital photo frames, navigators, or any other products or parts that have a display function. Because a problem solving principle of the display apparatus is similar to that of the display substrate, for implementation of the display apparatus, reference may be made to implementation of the above display substrate, and repetition will not be made.

According to the display substrate, the method for preparing the display substrate, and the display apparatus provided by the embodiments of the present disclosure, the communication slots are arranged in the pixel defining layer, and in at least one row of pixels, the openings of the sub-pixels of the same color communicate with one another through the communication slots. Therefore, in an inkjet printing process, ink droplets sprayed by different nozzles may flow among the openings communicating with one another through the communication slots, defects caused by errors of inkjet amount among different nozzles may be overcome, uniformity of a thickness of an organic film layer formed by an inkjet printing technique is improved, and uniformity of brightness of an organic light-emitting diode is thereby improved.

Obviously, those of skill in the art can make various changes and modifications to the present disclosure without departing from the spirit and scope of the present disclosure. Thus, provided that these changes and modifications of the present disclosure fall within the scope of the claims of the present disclosure and their equivalents, the present disclosure is also intended to cover these modifications and variations.

What is claimed is:

1. A display substrate, wherein the display substrate is provided with a plurality of sub-pixels of at least three colors, the plurality of sub-pixels are arranged into a plurality of rows of pixels in a first direction, sub-pixels of respective colors in each row of pixels are circularly arranged according to a set sequence, the plurality of rows of pixels are sequentially arranged in a second direction, the first direction and the second direction intersect with each other, and the display substrate comprises:
 a base substrate;
 a pixel defining layer, located on the base substrate and comprising:
  a plurality of openings located in the plurality of sub-pixels respectively; and
  communication slots;
  wherein at least a portion of the communication slots are located in gaps between adjacent rows of pixels; and in at least one row of pixels, openings in sub-pixels of a same color communicate with one another through corresponding communication slots; and an organic light-emitting functional layer, located in the plurality of openings corresponding to the plurality of sub-pixels;

wherein the communication slots comprise first communication slots and second communication slots;

the first communication slots are located in the gaps between adjacent rows of pixels; and the second communication slots connect the first communication slots and the openings, and the second communication slots are located at edges of the openings close to sides of the first communication slots;

wherein the first communication slots penetrate through the pixel defining layer in a thickness direction, and a distance between an inner bottom face of a second communication slot and a surface of a side of the pixel defining layer close to the base substrate is larger than zero and is smaller than a maximum thickness of the pixel defining layer;

the inner bottom face of the second communication slot has a lyophilic property; and a surface, in addition to the second communication slots, of a side of the pixel defining layer facing away from the base substrate has lyophobicity.

2. The display substrate according to claim 1, wherein in a row of pixels, the sub-pixels comprise a plurality of first sub-pixels of a same color, and openings in the first sub-pixels are connected with corresponding communication slots on a same side of the row of pixels.

3. The display substrate according to claim 2, wherein in the row of pixels, the sub-pixels further comprise a plurality of second sub-pixels of a same color, and openings in the second sub-pixels are connected with corresponding communication slots on a same side of the row of pixels; and the communication slots corresponding to the first sub-pixels and the communication slots corresponding to the second sub-pixels are located on different sides of the row of pixels.

4. The display substrate according to claim 3, wherein in the row of pixels, the sub-pixels further comprise a plurality of third sub-pixels of a same color; wherein the row of pixels comprises a plurality of pixel units arranged in the first direction, and each first sub-pixel, second sub-pixel and third sub-pixel adjacent to one another constitute one pixel unit;

the pixel unit is rectangular and comprises a first side edge and a second side edge which extend in the first direction; and in the pixel unit, an edge of the first sub-pixel coincides with the first side edge, an edge of the second sub-pixel coincides with the second side edge, and the third sub-pixel is arranged around the first sub-pixel and the second sub-pixel; and in the row of pixels, groove structures are provided between adjacent pixel units, and openings in the third sub-pixels in the row of pixels communicate with one another through the groove structures.

5. The display substrate according to claim 4, wherein two rows of pixels on two sides of any one gap are symmetrically arranged relative to the gap; and the communication slots connect corresponding openings to sub-pixels of a same color in every two adjacent rows of pixels.

6. The display substrate according to claim 4, wherein in the second direction, either a width of the first sub-pixel or a width of the second sub-pixel is smaller than a width of the pixel unit.

7. The display substrate according to claim 6, wherein the first sub-pixels are red sub-pixels, the second sub-pixels are green sub-pixels and the third sub-pixels are blue sub-pixels; and areas of the third sub-pixels are larger than areas of the first sub-pixels, and the areas of third sub-pixels are larger than areas of the second sub-pixels.

8. The display substrate according to claim 4, wherein a distance between an inner bottom face of a groove structure and a surface of a side of the pixel defining layer close to the base substrate is larger than zero and is smaller than a maximum thickness of the pixel defining layer; and the inner bottom face of the groove structure has a lyophilic property.

9. A method for preparing the display substrate according to claim 1, comprising:

forming the pixel defining layer on the base substrate;

patterning the pixel defining layer to form the plurality of openings and communication slots; and adopting an inkjet printing technique to form the organic light-emitting functional layer in the plurality of openings.

10. The method according to claim 9, wherein said forming the pixel defining layer on the base substrate, and patterning the pixel defining layer to form the plurality of openings and communication slots comprises:

adopting a lyophobic material to form the pixel defining layer on the base substrate; and adopting a halftone mask to pattern the pixel defining layer to obtain the openings, first communication slots penetrating through the pixel defining layer in a thickness direction, and second communication slots and groove structures whose inner bottom faces have a lyophilic property.

11. A display apparatus, comprising: a display substrate, wherein the display substrate is provided with a plurality of sub-pixels of at least three colors, the plurality of sub-pixels are arranged into a plurality of rows of pixels in a first direction, sub-pixels of respective colors in each row of pixels are circularly arranged according to a set sequence, the plurality of rows of pixels are sequentially arranged in a second direction, the first direction and the second direction intersect with each other, and the display substrate comprises:

a base substrate;

a pixel defining layer, located on the base substrate and comprising:

a plurality of openings located in the plurality of sub-pixels respectively; and communication slots;

wherein at least a portion of the communication slots are located in gaps between adjacent rows of pixels; and in at least one row of pixels, openings in sub-pixels of a same color communicate with one another through corresponding communication slots; and an organic light-emitting functional layer, located in the plurality of openings corresponding to the plurality of sub-pixels;

wherein the communication slots comprise first communication slots and second communication slots;

the first communication slots are located in the gaps between adjacent rows of pixels; and the second communication slots connect the first communication slots and the openings, and the second communication slots are located at edges of the openings close to sides of the first communication slots;
wherein the first communication slots penetrate through the pixel defining layer in a thickness direction, and a distance between an inner bottom face of a second communication slot and a surface of a side of the pixel defining layer close to the base substrate is larger than zero and is smaller than a maximum thickness of the pixel defining layer;
the inner bottom face of the second communication slot has a lyophilic property; and
a surface, in addition to the second communication slots, of a side of the pixel defining layer facing away from the base substrate has lyophobicity.

12. The display apparatus according to claim 11, wherein in a row of pixels, the sub-pixels comprise a plurality of first sub-pixels of a same color, and openings in the first sub-pixels are connected with corresponding communication slots on a same side of the row of pixels.

13. The display apparatus according to claim 12, wherein in the row of pixels, the sub-pixels further comprise a plurality of second sub-pixels of a same color, and openings in the second sub-pixels are connected with corresponding communication slots on a same side of the row of pixels; and
the communication slots corresponding to the first sub-pixels and the communication slots corresponding to the second sub-pixels are located on different sides of the row of pixels.

14. The display apparatus according to claim 13, wherein in the row of pixels, the sub-pixels further comprise a plurality of third sub-pixels of a same color; wherein the row of pixels comprises a plurality of pixel units arranged in the first direction, and each first sub-pixel, second sub-pixel and third sub-pixel adjacent to one another constitute one pixel unit;
the pixel unit is rectangular and comprises a first side edge and a second side edge which extend in the first direction; and in the pixel unit, an edge of the first sub-pixel coincides with the first side edge, an edge of the second sub-pixel coincides with the second side edge, and the third sub-pixel is arranged around the first sub-pixel and the second sub-pixel; and
in the row of pixels, groove structures are provided between adjacent pixel units, and openings in the third sub-pixels in the row of pixels communicate with one another through the groove structures.

15. The display apparatus according to claim 14, wherein two rows of pixels on two sides of any one gap are symmetrically arranged relative to the gap; and
the communication slots connect openings corresponding to sub-pixels of a same color in every two adjacent rows of pixels.

16. The display apparatus according to claim 14, wherein a distance between an inner bottom face of a groove structure and a surface of a side of the pixel defining layer close to the base substrate is larger than zero and is smaller than a maximum thickness of the pixel defining layer; and
the inner bottom face of the groove structure has a lyophilic property.

17. A display substrate, wherein the display substrate is provided with a plurality of sub-pixels of at least three colors, the plurality of sub-pixels are arranged in a plurality of rows of pixels in a first direction, sub-pixels of respective colors in each row of pixels are circularly arranged according to a set sequence, the plurality of rows of pixels are sequentially arranged in a second direction, the first direction and the second direction intersect with each other, and the display substrate comprises:
a base substrate;
a pixel defining layer, located on the base substrate and comprising:
a plurality of openings located in the plurality of sub-pixels respectively; and
communication slots;
wherein at least a portion of the communication slots are located in gaps between adjacent rows of pixels; and
in at least one row of pixels, openings in sub-pixels of a same color communicate with one another through corresponding communication slots; and
an organic light-emitting functional layer, located in the plurality of openings corresponding to the plurality of sub-pixels;
wherein the communication slots comprise first communication slots and second communication slots;
the first communication slots are located in the gaps between adjacent rows of pixels; and
the second communication slots connect the first communication slots and the openings, and the second communication slots are located at edges of the openings close to sides of the first communication slots;
wherein in a row of pixels, the sub-pixels comprise a plurality of first sub-pixels of a same color, and openings in the first sub-pixels are connected with corresponding communication slots on a same side of the row of pixels;
wherein in the row of pixels, the sub-pixels further comprise a plurality of second sub-pixels of a same color, and openings in the second sub-pixels are connected with corresponding communication slots on a same side of the row of pixels; and
the communication slots corresponding to the first sub-pixels and the communication slots corresponding to the second sub-pixels are located on different sides of the row of pixels;
wherein in the row of pixels, the sub-pixels further comprise a plurality of third sub-pixels of a same color; wherein
the row of pixels comprises a plurality of pixel units arranged in the first direction, and each first sub-pixel, second sub-pixel and third sub-pixel adjacent to one another constitute one pixel unit;
the pixel unit is rectangular and comprises a first side edge and a second side edge which extend in the first direction; and in the pixel unit, an edge of the first sub-pixel coincides with the first side edge, an edge of the second sub-pixel coincides with the second side edge, and the third sub-pixel is arranged around the first sub-pixel and the second sub-pixel; and
in the row of pixels, groove structures are provided between adjacent pixel units, and openings in the third sub-pixels in the row of pixels communicate with one another through the groove structures.

18. The display substrate according to claim 17, wherein two rows of pixels on two sides of any one gap are symmetrically arranged relative to the gap; and
the communication slots connect openings corresponding to sub-pixels of a same color in every two adjacent rows of pixels.

19. The display substrate according to claim 17, wherein in the second direction, either a width of the first sub-pixel or a width of the second sub-pixel is smaller than a width of the pixel unit.

20. The display substrate according to claim 17, wherein a distance between an inner bottom face of a groove structure and a surface of a side of the pixel defining layer close to the base substrate is larger than zero and is smaller than a maximum thickness of the pixel defining layer; and the inner bottom face of the groove structure has a lyophilic property.

* * * * *